(12) United States Patent  
Hamerski et al.

(10) Patent No.: US 7,709,864 B2  
(45) Date of Patent: May 4, 2010

(54) HIGH-EFFICIENCY SCHOTTKY RECTIFIER AND METHOD OF MANUFACTURING SAME

(75) Inventors: Roman Hamerski, Overland Park, KS (US); Chris Hruska, Blue Springs, MO (US); Fazia Hossain, Lee's Summit, MO (US)

(73) Assignee: Diodes Fabtech Inc, Lee's Summit, MO (US)

( * ) Notice: Subject to any disclaimer, the term of this patent is extended or adjusted under 35 U.S.C. 154(b) by 815 days.

(21) Appl. No.: 11/400,621

(22) Filed: Apr. 7, 2006

(65) Prior Publication Data

US 2007/0235830 A1    Oct. 11, 2007

(51) Int. Cl.  
*H01L 29/80* (2006.01)

(52) U.S. Cl. .................. 257/284; 257/256; 257/263; 257/267; 257/471; 257/E29.041

(58) Field of Classification Search .................. 257/256, 257/263, 267, 284, 471, E29.041  
See application file for complete search history.

(56) References Cited

U.S. PATENT DOCUMENTS 4,568,958 A * 2/1986 Baliga ...................... 257/332  
2006/0170036 A1* 8/2006 Yilmaz ...................... 257/329

* cited by examiner

*Primary Examiner*—Matthew E Warren  
(74) *Attorney, Agent, or Firm*—Spencer Fan Britt & Browne LLP

(57) ABSTRACT

A rectifier device (10) comprising a multi-layer epitaxial film (12) and a rectifier and a transistor manufactured in the film (12), wherein the transistor is oriented vertically relative to the plane of the rectifier. The rectifier and transistor are separated by a transition zone of inverted bias. The rectifier is a Schottky barrier rectifier, and the transistor is a JFET. More specifically, the device (1) comprises the film (12), a trench (16), a first region (18) associated with an upper portion of the trench (16), and second region (20) associated with a lower portion. The interface between the p+ material of the second region (20) and the n material of the film (12) creates a p+/n junction. The device (10) has use in high frequency, low-loss power circuit applications in which high switching speed and low forward voltage drop are desirable.

10 Claims, 14 Drawing Sheets

HIGH-EFFICIENCY SCHOTTKY RECTIFIER AND METHOD OF MANUFACTURING SAME

FIELD OF THE INVENTION

The present invention relates broadly to semiconductor rectifier devices, especially Schottky rectifiers, and methods of manufacturing the same. More specifically, the present invention concerns a two-terminal semiconductor rectifier device comprising an integrated Schottky barrier rectifier and vertically-oriented junction field effect transistor (JFET) separated by a transition zone of inverted bias resulting from a three-layer epitaxial film, and a method of manufacturing the same.

BACKGROUND OF THE INVENTION

Modern power circuits require power rectifiers with improved power switching performance. For some applications, p+/n rectifiers with high switching speeds are used. High switching speeds are necessary to minimize reverse current flow during recovery. Majority carrier devices, such as Schottky barrier rectifiers, are often used because they offer both improved switching speed and lower forward voltage drop. Unfortunately, Schottky barrier rectifiers suffer from undesirably high reverse leakage current when operating at elevated temperatures.

Several improvements have been introduced to improve the blocking ability of Schottky rectifiers. One improvement is the junction barrier Schottky (JBS) rectifier, which combines a p/n junction grid with Schottky barrier regions which are sufficiently small so that the expanding space charge region from the p+/n junction grid leads to the elimination of the Schottky barrier lowering which is otherwise caused by the resulting image charge. For the JBS rectifier, there is a net reduction in leakage current of approximately 50% for the same chip area and forward voltage drop. This equates to an approximately 11 degree improvement in temperature in the power dissipation curve when operating at a 50% duty cycle.

Another improvement is trench Schottky, which is useful for higher voltage applications in which the forward voltage drop exceeds 0.7 volts and the JBS rectifier ceases to operate as a majority carrier device. For example, the trench MOS barrier-controlled Schottky (MBS) rectifier has a lower forward voltage drop than the p-i-n rectifier for breakdown voltages up to 250V, and still operates as a majority carrier device.

In addition to these high voltage applications, however, there is an increasing demand for low voltage applications, for which conventional trench Schottky is not well-suited. Trench Schottky requires that, in the blocking state, the inner trenches are sufficiently closely spaced and the adjacent areas of the body portion are sufficiently lowly doped that the depletion layer formed in the body portion depletes the intermediate areas of the body portion between the trenches at a smaller voltage than the breakdown voltage. In that way, the reverse voltage blocking characteristic is improved. Unfortunately, it also results in a significant reduction of the area available for the Schottky barrier because the trench may consume as much as 50% of the available area on a chip.

SUMMARY OF THE INVENTION

The present invention provides a high-efficiency two-terminal semiconductor device comprising a Schottky barrier rectifier and a vertically-oriented JFET separated by a transition zone of inverted bias resulting from a three-layer epitaxial film, and a method of manufacturing the same. The device has use, for example, in high frequency, low-loss power circuit applications in which high switching speed and low forward voltage drop are desirable.

In one embodiment, the device broadly comprises a multi-layer epitaxial film, a first structure manufactured in the multi-layer epitaxial film, and a second structure manufactured in the multi-layer epitaxial film and oriented vertically relative to the first structure. The first structure and the second structure are separated by a transition zone of inverted bias resulting from the multi-layer epitaxial film. In one embodiment, the first structure is a Schottky barrier rectifier, and the second structure is a JFET.

More specifically, the semiconductor device comprises a substrate, with the multi-layer epitaxial film overlaying a top surface of the substrate, a trench manufactured in the multi-layer epitaxial film, a first region associated with an upper portion of the trench, and a second region associated with a lower portion of the trench. The substrate includes n-type silicon, and the multi-layer epitaxial film includes n-type material which is doped with phosphorus. The multi-layer epitaxial film includes three layers. The trench is approximately between 4 micrometers and 5 micrometers deep and approximately 1 micrometer wide, and is substantially filled with conductive polysilicon which is doped with a p-type dopant, such as boron. The first trench region is insulated with a dielectric layer from the uppermost (third) layer of the epitaxial film. In the second trench region, boron-doped polysilicon is in direct contact with the first and second layers of the epitaxial film, forming a p+/n junction.

In one embodiment, the method of making the semiconductor device proceeds broadly as follows. Initially, the layers of the multi-layer epitaxial film are deposited in a single deposition process. During this process, the resistivity of one or more of the layers is established by introducing controlled amounts of n-type dopants in order to achieve desirable electrical characteristics for the layers. Alternatively, the desired resistivity profile can be established using subsequent diffusion processes. More specifically, the first layer is modified with an n-type dopant to provide a particular breakdown voltage; the second layer is modified with an n-type dopant to provide an area of reverse-direction electric field when the device is reverse-biased; and the third layer is modified with an n-type dopant to support and separate a first space charge region associated with an upper portion of the device and a second space charge region associated with the lower portion of the trench. The upper portion of the trench is etched into the multi-layer epitaxial film, and the first trench region is formed by associating an oxide with a surface of the upper portion of the trench. The lower portion of the trench is then etched, and the trench is substantially filled with the polysilicon doped with boron. The second trench region is formed by diffusing the boron into a surface of the lower portion of the trench. The device provides such desirable electrical characteristics as low forward voltage drop, low reverse current leakage, and very fast switching speed matching that of Schottky rectifiers and JFETs, while remaining a majority carrier device. The device, much like a JBS rectifier, eliminates the Schottky barrier lowering which occurs in standard Schottky rectifiers, but also reverses the direction of the electric field for the portion of the drift region of the diode under current blocking bias, which reduces the reverse leakage current more effectively than the JBS rectifier. Additionally, the device better utilizes chip surface area than MBS when designed for low voltage, low VF application.

These and other features of the invention are described in greater detail in the section titled DETAILED DESCRIPTION, below.

BRIEF DESCRIPTION OF THE DRAWINGS

A preferred embodiment of the present invention is described in detail below with reference to the attached drawing figures, wherein.

DETAILED DESCRIPTION

Figure 1:
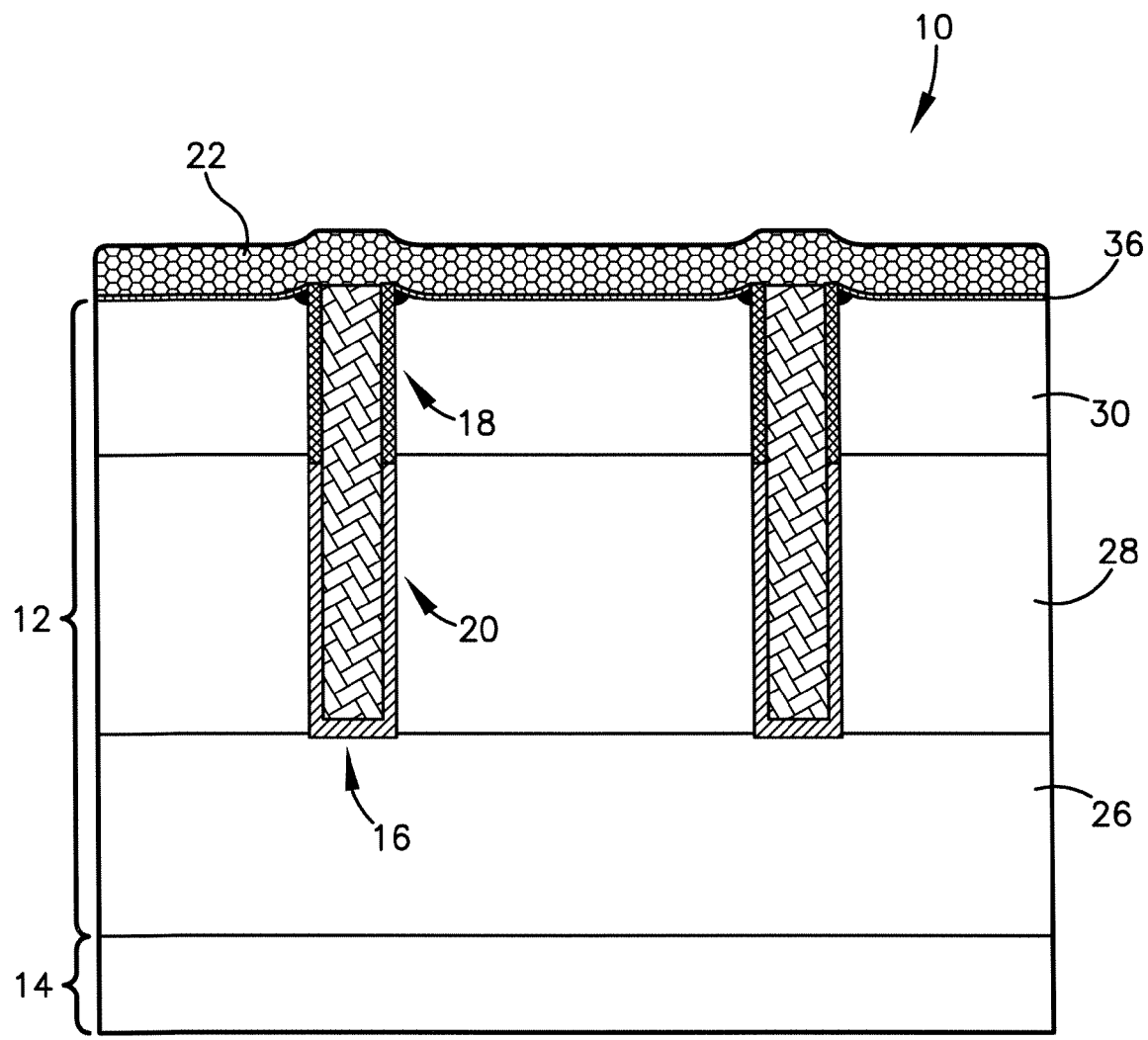
FIG. 1 is a cross-sectional elevation view of an embodiment of the device of the present invention.

With reference to the figures, a semiconductor rectifier device 10 is herein described, shown, and otherwise disclosed in accordance with a preferred embodiment of the present invention. In one embodiment, the device broadly comprises a high-efficiency two-terminal rectifier comprising a multi-layer epitaxial film, a first structure manufactured in the multi-layer epitaxial film, and a second structure manufactured in the multi-layer epitaxial film and oriented vertically relative to the first transistor. The first structure and the second structure are separated by a transition zone of inverted bias resulting from the multi-layer epitaxial film. In one embodiment, the first structure is a Schottky barrier rectifier, and the second structure is a JFET. The device 10 has use, for example, in high frequency, low-loss power circuit applications in which high switching speed and low forward voltage drop are desirable.

In one embodiment, the device 10 more specifically comprises the multi-layer epitaxial film 12, a substrate 14, a trench 16, a first region 18 associated with an upper portion of the trench 16, a second region 20 associated with a lower portion of the trench 16, and an anode 22. The interface between the p+ doped second trench region 20 and the n material of the multi-layer epitaxial film creates a p+/n junction.

The multi-layer epitaxial film 12 substantially overlays a top surface of the substrate 14. In one embodiment, the multi-layer epitaxial film 12 includes a first layer 26 having a thickness of approximately 2 micrometers and a resistivity of approximately 0.35 Ohm-cm; a second layer 28 having a thickness of approximately 3 micrometers and a resistivity of approximately 0.5 Ohm-cm; and a third layer 30 having a thickness of approximately 2.5 micrometers and a resistivity of 0.08 Ohm-cm. The resistivity of the third layer 30 is as low as the targeted minimum breakdown voltage allows in order to minimize a series resistance of the p+/n junction diode.

In one embodiment, the thickness and operating characteristics, such as resistivity, of some or all of the layers 26, 28, 30 results from dopants added during the epitaxial deposition process. In another embodiment, the layers are modified by doping during one or more diffusion processes following the initial epitaxial deposition process. The n-type dopant may be phosphorous, and a different n-type dopant quantity may be used for each layer. In one embodiment, the first layer 26 is doped to provide a breakdown voltage of 30 volts or higher; the second layer 28 is doped to provide an area of reverse-direction electric field when the device 10 is reverse-biased; and the third layer, which has the lowest resistivity, is doped to support and separate a space charge region of the reverse-biased Schottky contact and a space charge region of the p+/n junction at the lower portion of the trench 16.

The substrate 14 is an n-type silicon substrate having a wafer resistivity of approximately between 0.002 Ohm-cm and 0.005 Ohm-cm. In one embodiment, the substrate 14 is doped with arsenic; in another embodiment, the substrate 14 is doped with antimony; in another embodiment the substrate is doped with phosphorous.

Figure 17:
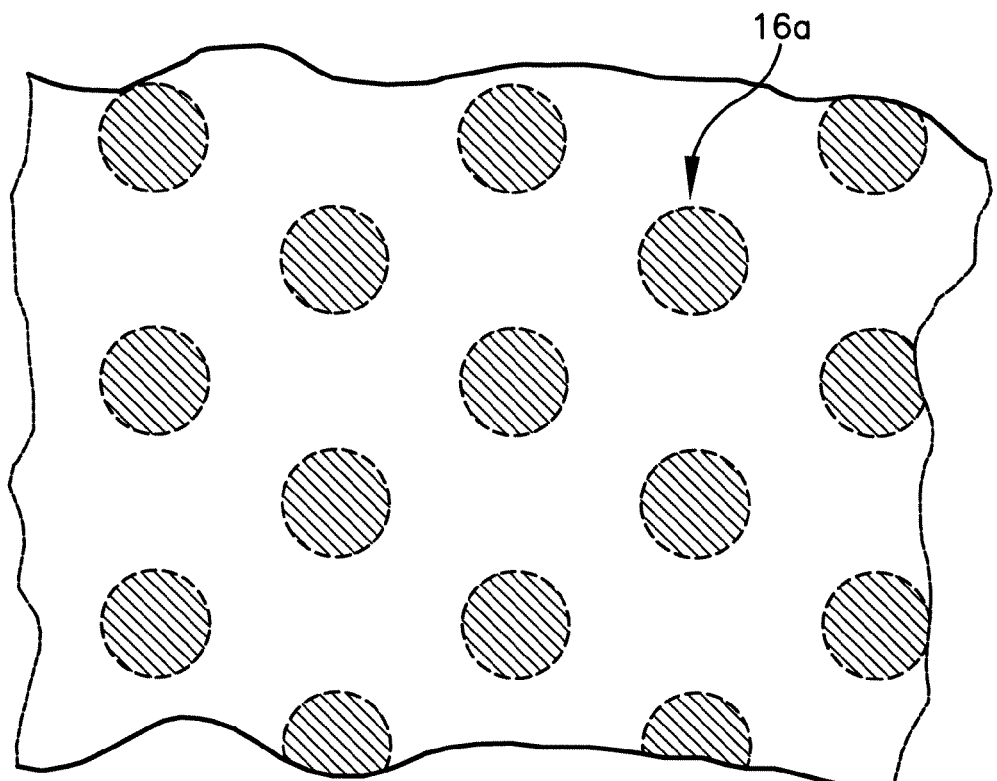
FIG. 17 is a fragmentary plan view showing a first shape and spacing relation of the trenches.
Figure 18:
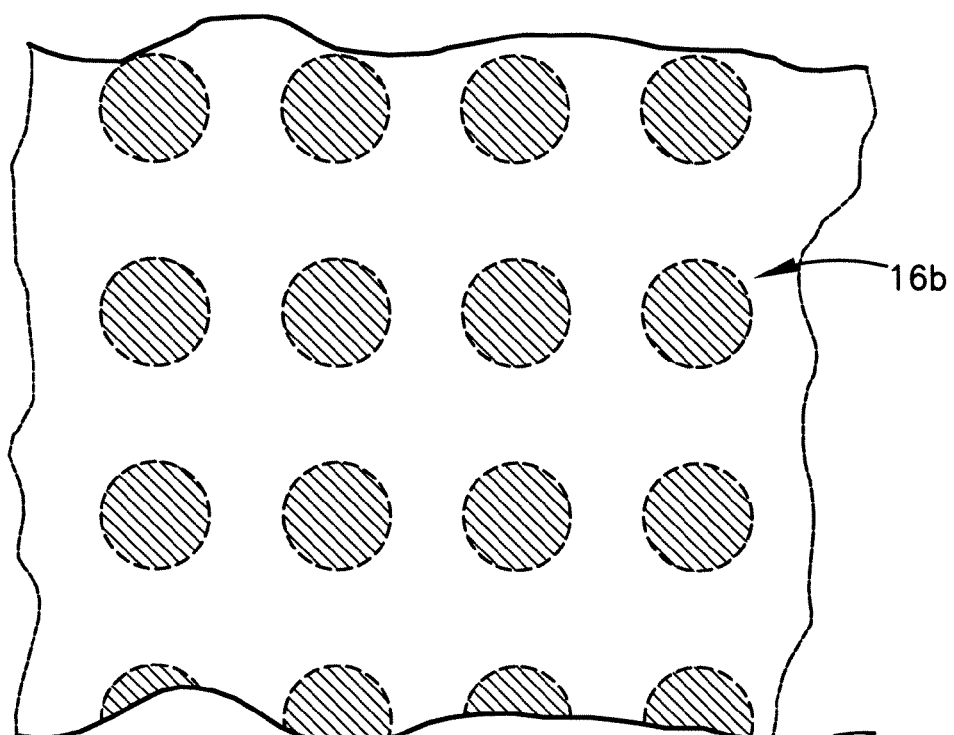
FIG. 18 is a fragmentary plan view showing a second shape and spacing relation of the trenches.
Figure 19:
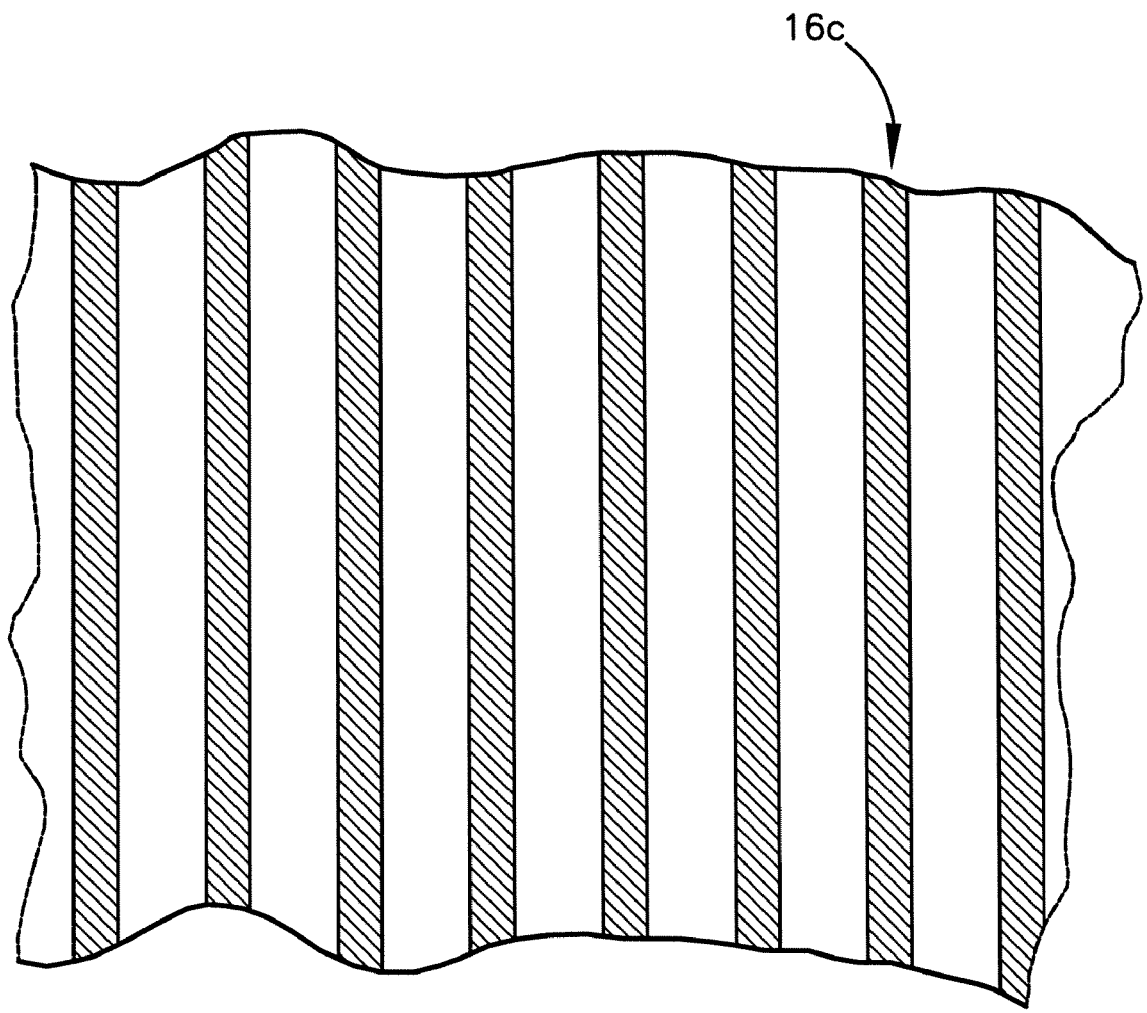
FIG. 19 is a fragmentary plan view showing a third shape and spacing relation of the trenches.

In one embodiment, the trench 16 is approximately between 4 micrometer and 5 micrometers deep, and approximately 1 micrometer wide. In another embodiment, the trench is approximately 4.5 micrometers deep, and approximately 1 micrometer wide. The trench is substantially filled with polysilicon. In one embodiment, the polysilicon is doped with boron. A plurality of such trenches 16 are etched into the substrate 16. FIGS. 17, 18, 19 show a variety of different shapes and spacing relations for the trenches 16a, 16b, 16c.

The first trench region 18 is insulated with a dielectric layer from the uppermost (third) layer 30 of the epitaxial film 12. The first trench region, in combination with the third epitaxial layer 30, operates to separate the space charge region of the reverse-biased Schottky barrier contact and the space charge region of the p+/n junction created at the lower portion of the trench 16. In one embodiment, the first insulating region 18 includes CVD oxide or, alternatively, thermal oxide ($SiO_2$).

In the second trench region 20, boron-doped polysilicon is in direct contact with the first and second layers of the epitaxial film, forming a p+/n junction. In one embodiment, the second trench region 20 includes boron-doped silicon.

The anode 22 is a Schottky barrier contact providing one terminal of the two-terminal device. In one embodiment, a layer of silicide 36 is interposed between the anode 22 and the upper surface of the third layer 30 of the epitaxial film 12. A cathode (not shown) is an Ohmic contact to the n+ substrate 14 providing the other terminal of the two-terminal device.

Figure 16:
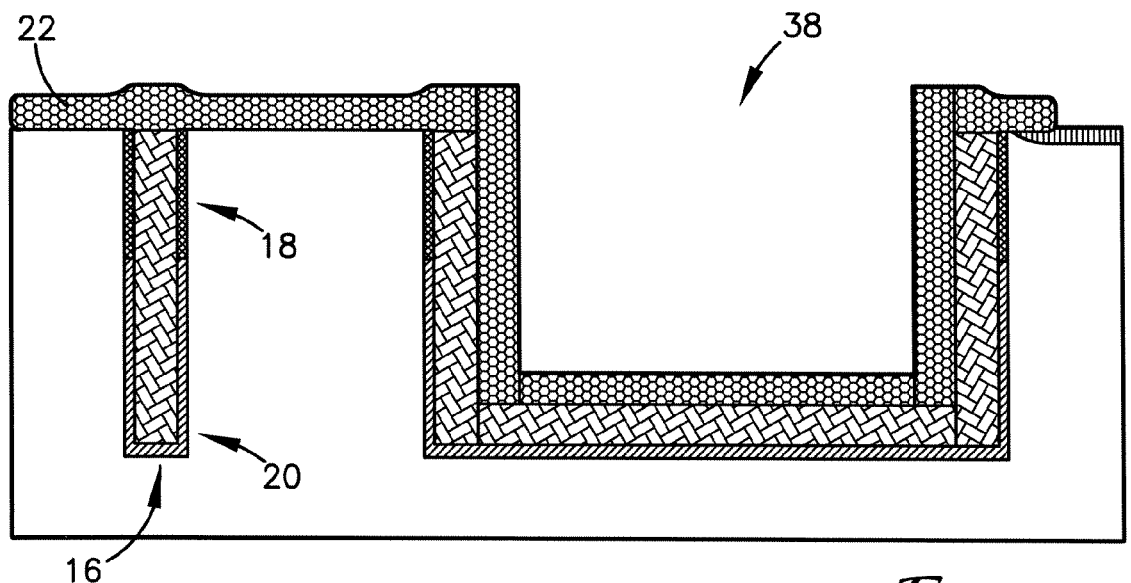
FIG. 16 is a cross-sectional elevation view following a twenty-first step in the method, showing the results of an etching process.

A guard ring 38, best seen in FIG. 16, absorbs forward current surge during operation of the device 10, and is formed substantially similar to and substantially simultaneous with the trench 16 described above. The guard ring 38 is substantially conventional in all other respects.

Figure 15:
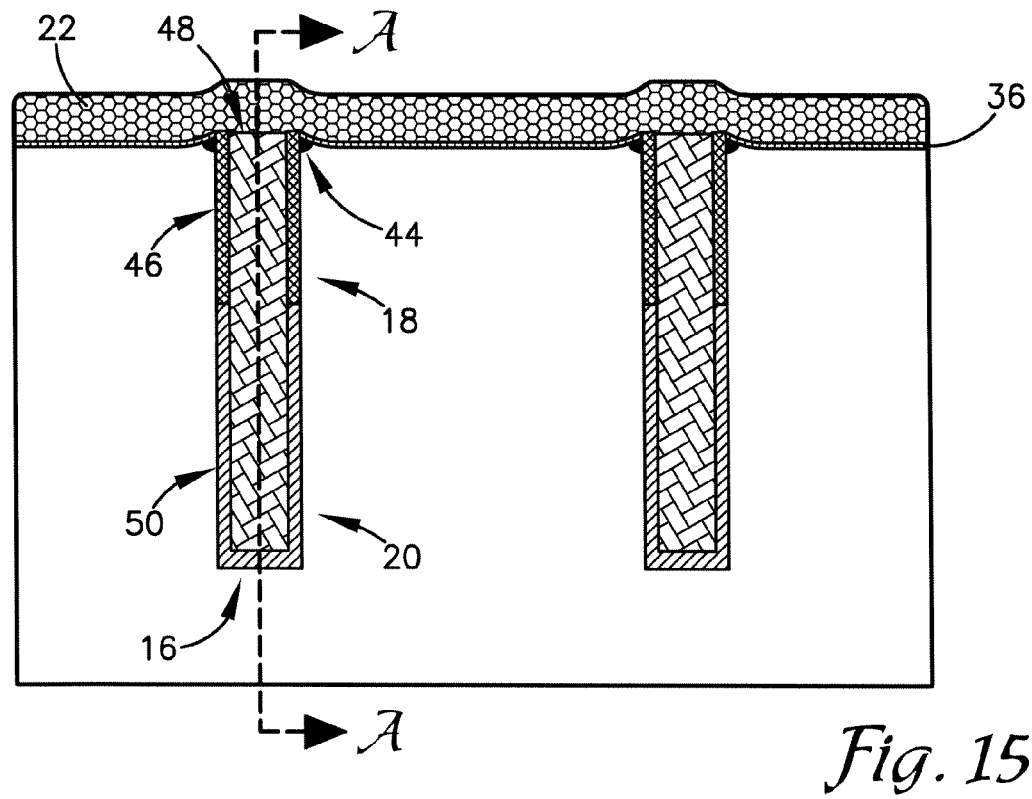
FIG. 15 is a cross-sectional elevation view following a nineteenth step in the method, showing a deposit of top metal.
Figure 20:
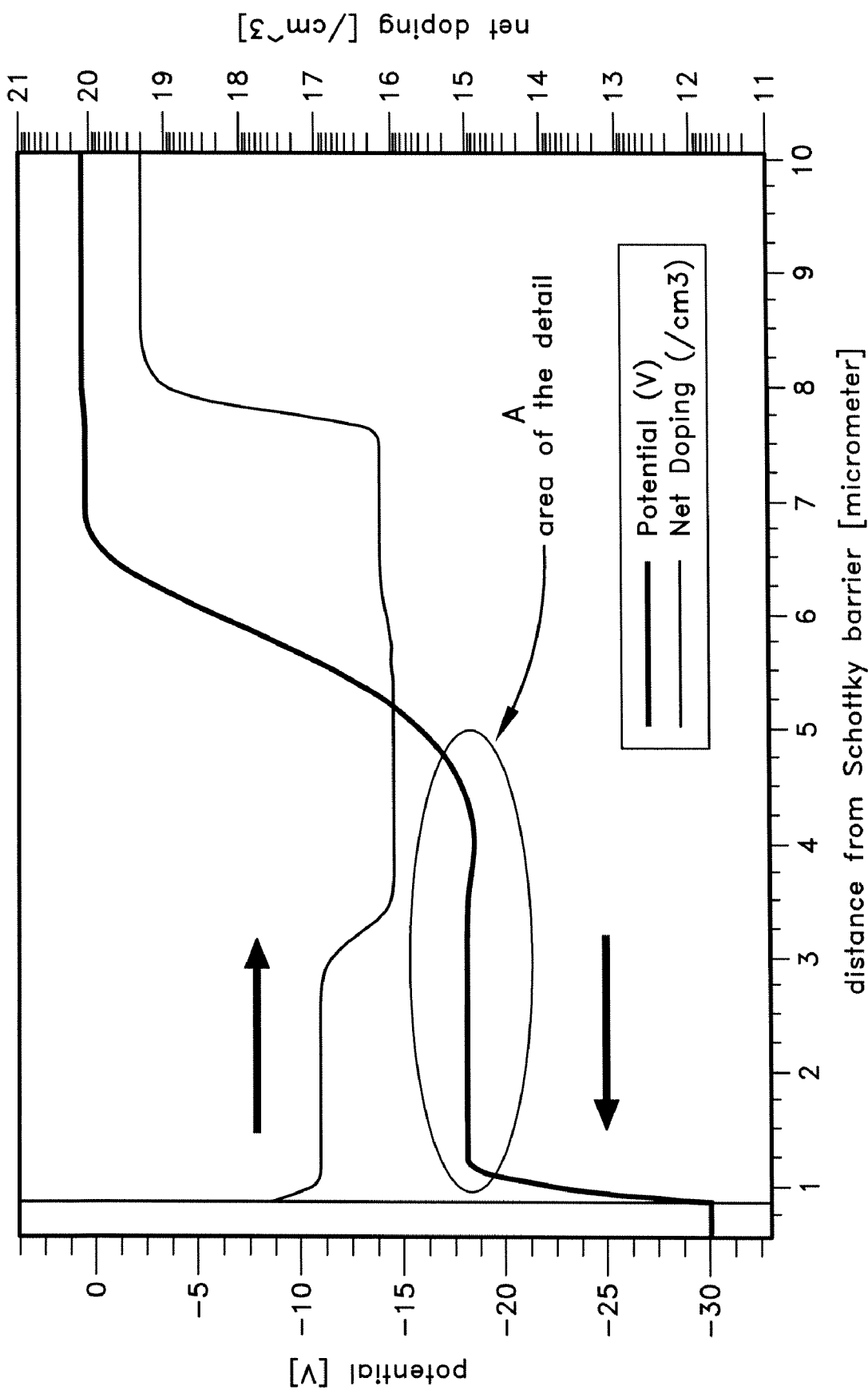
FIG. 20 is a first graph showing a potential profile of the device.
Figure 21:
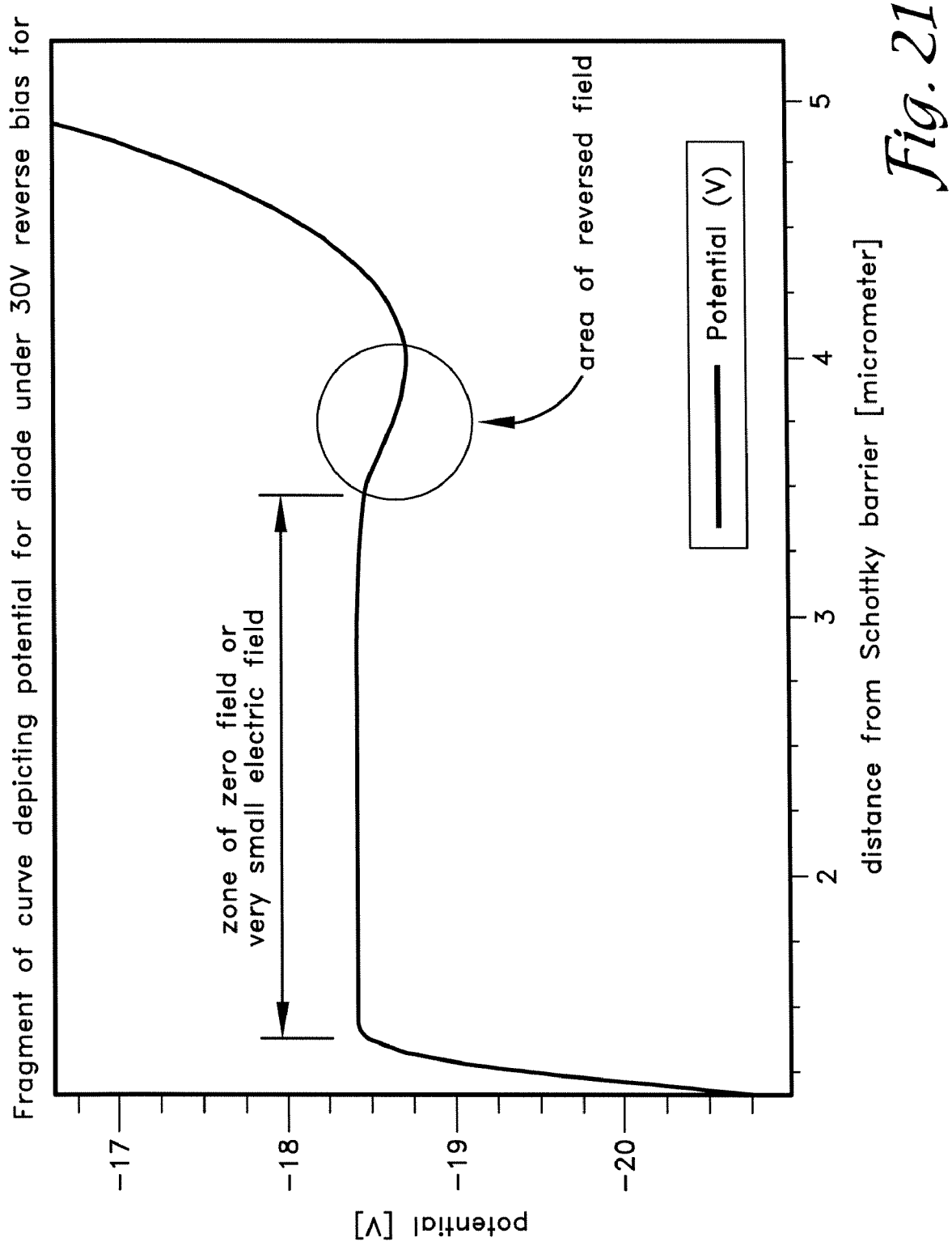
FIG. 21 is a second graph showing in greater detail area A of the first graph of FIG. 20.
Figure 22:
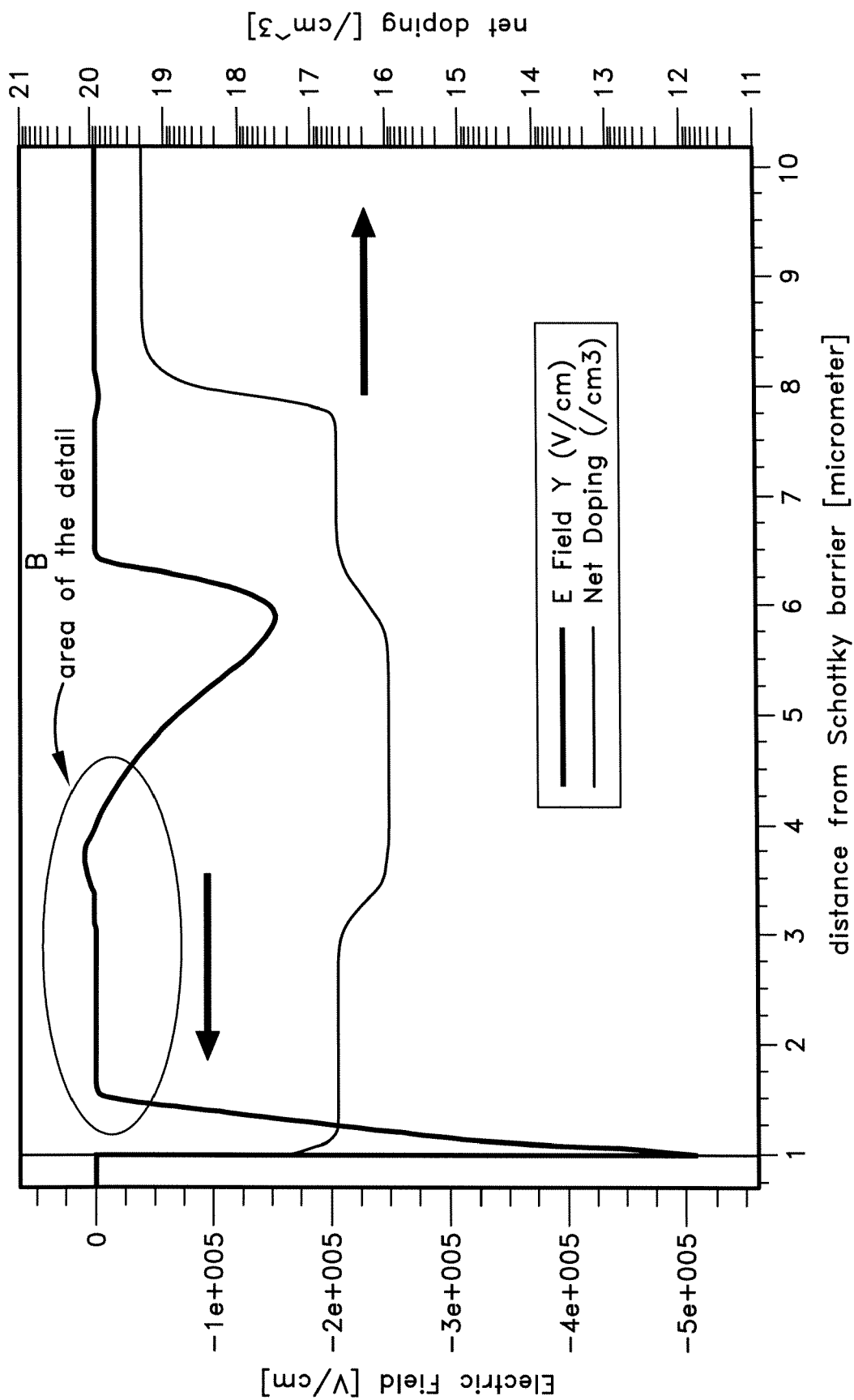
FIG. 22 is a third graph showing an electric field profile of the device along line AA of FIG. 15.
Figure 23:
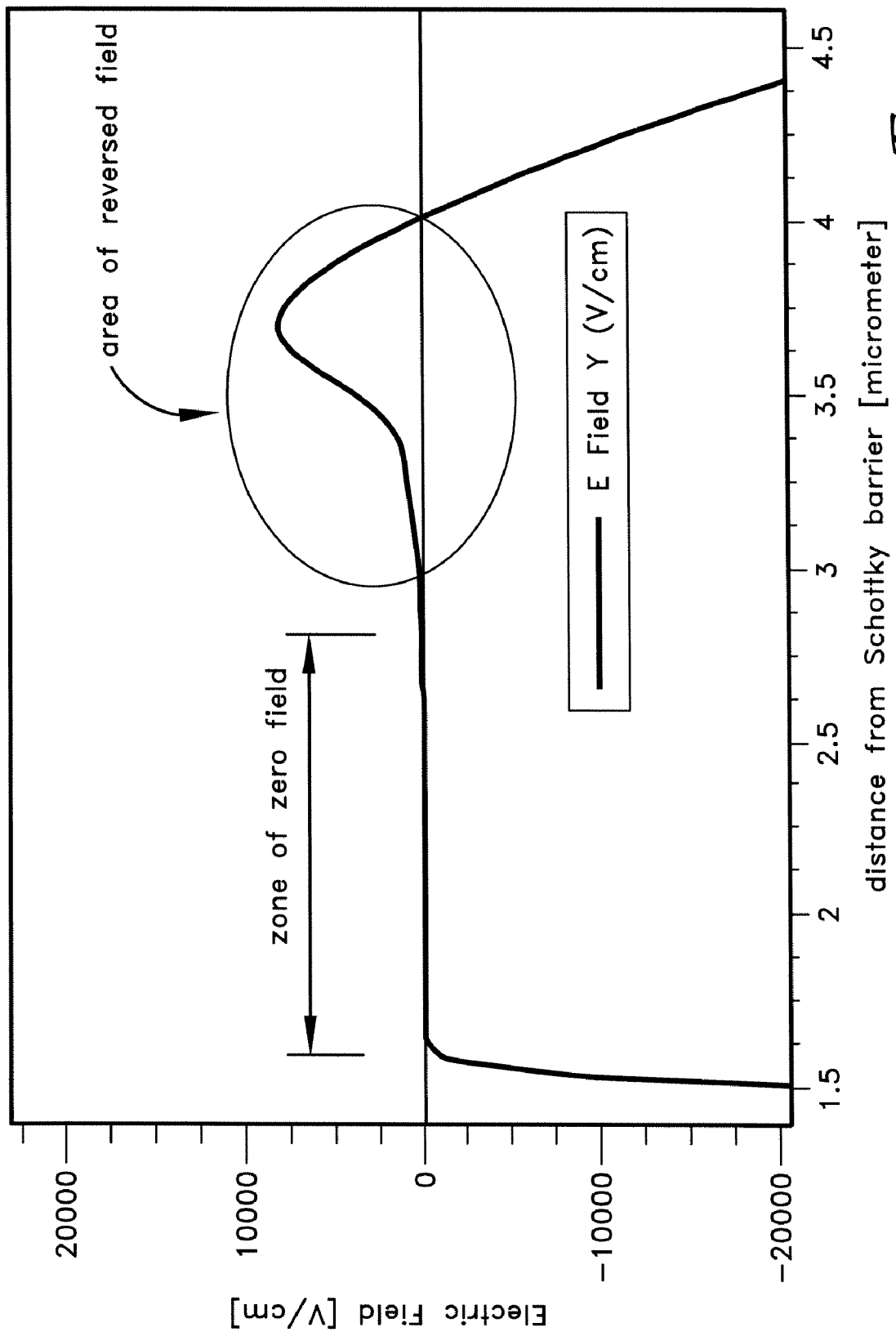
FIG. 23 is a fourth graph showing in greater detail area B of the third graph of FIG. 22.

The device 10 provides the transition zone of inverted bias between the upper Schottky barrier contact, i.e., anode 22, and the lower portion 20 of the trench 16 and the adjacent third epitaxial layer 26, which together support a reverse voltage of 30 volts or higher (see FIGS. 20 and 21 showing a potential profile, and FIGS. 22 and 23 showing an electric field profile on line AA of FIG. 15). In a forward bias mode (i.e., the anode 22 being positive and the cathode being negative) the direction of the electric field across the entire vertical structure is consistent with the external bias, so the forward voltage drop is as low as in conventional Schottky. The transition zone with a reversed electric field results from the multi-layer epitaxial film 12, the oxide ($SiO_2$) spacer provided at the upper portion 18 of the trench 16, and the p+ spacer provided at the lower portion 20 of the trench 16 working with the third epitaxial layer 26. More specifically, the third layer 30 of the epitaxial film 12 is heavily doped so that the space charge regions of the reverse-biased Schottky diode and the space charge region of p+/n junction around the lower portion 20 of the trench 16 do not overlap. Without the spacer at the first trench region 18 and the thickness and very low resistivity of the third epitaxial layer 30, the device 10 would function as a JBS rectifier. When the device 10 is forward-biased, the space charge region from the p-doped trench 16 does not interfere with the field pattern, resulting in low forward voltage drop.

In one embodiment, the device 10 is constructed substantially as follows. It should be understood and appreciated that any one or more of the following steps may be eliminated or substituted with an equivalent alternative step; furthermore, it should be understood and appreciated that the order of any one or more of the following steps may be changed.

Figure 2:
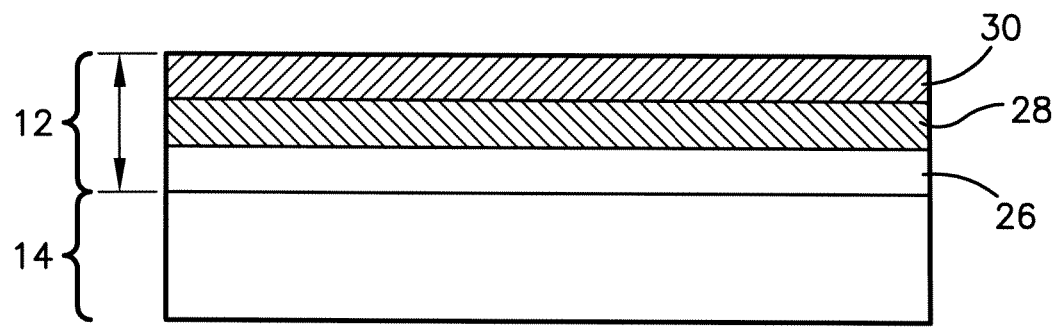
FIG. 2 is a cross-sectional elevation view of the device following an initial in a method of making the device of FIG. 1, showing a multi-layer epitaxial film having been deposited on a substrate.

In an initial step, shown in FIG. 2, some or all of the layers of the multi-layer epitaxial film 12 are deposited on the substrate 14 in a single deposition cycle using a standard epitaxial deposition process which is controlled, at least with respect to temperature, time, and gas flow rates, including the n-dopant gas flow rate, by a microprocessor.

When doping is not performed during the initial epitaxial deposition process: in a second step, one or more of the layers 26, 28, 30 are modified by one or more diffusion processes which introduce dopants, such as phosphorous, which result in desirable thicknesses and operating characteristics, such as those discussed above. In a third step, silicon nitride 40 is deposited on the upper surface of the third layer 30 of the epitaxial film 12 to a thickness of approximately 1500 Angstroms.

Figure 3:
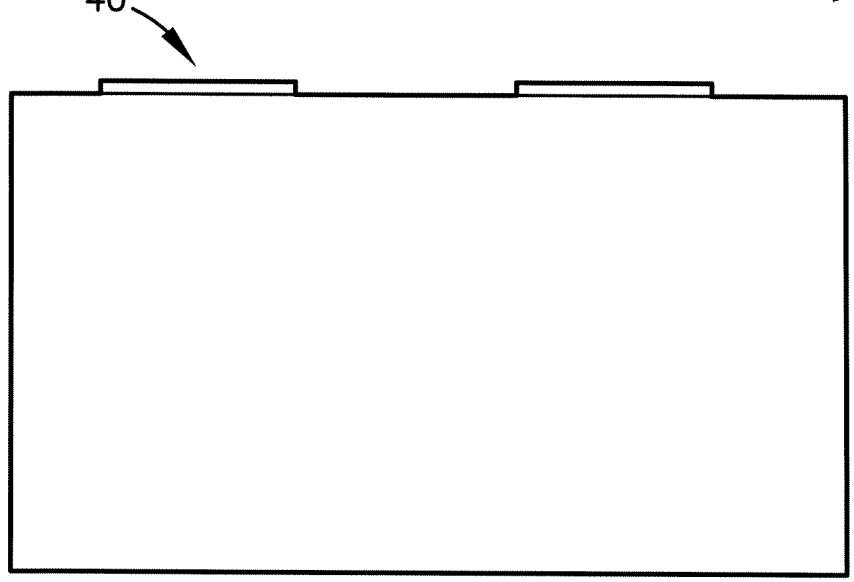
FIG. 3 is a cross-sectional elevation view following a fourth step in the method, showing a deposit of nitride.

In a fourth step, shown in FIG. 3, a first photolithography process is performed to pattern-etch the silicon nitride 40, leaving circles or stripes approximately 1.4 micrometers in diameter or width.

Figure 4:
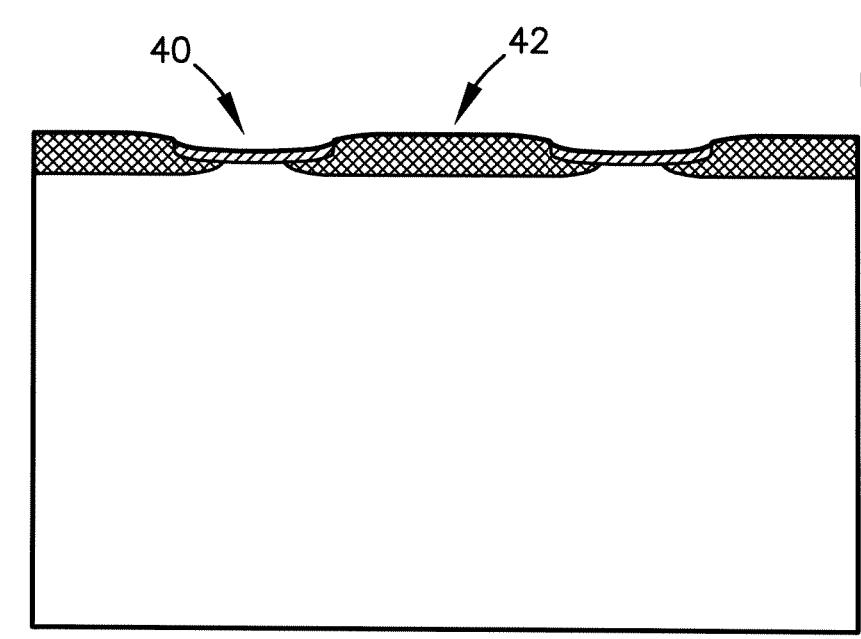
FIG. 4 is a cross-sectional elevation view following a fifth step in the method, showing a layer of oxide.

In a fifth step, shown in FIG. 4, thermal oxide ($SiO_2$) 42 is grown approximately 0.5 micrometers thick using a LOCOS (localized oxidation of silicon) process.

Figure 5:
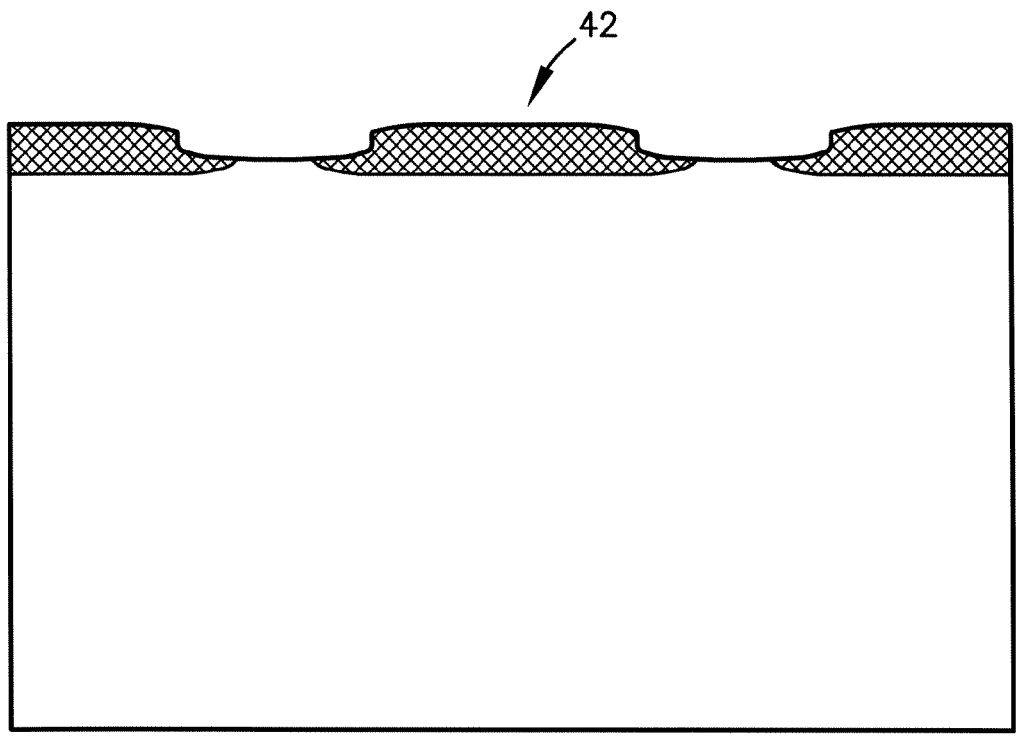
FIG. 5 is a cross-sectional elevation view following a sixth step in the method, showing the nitride of FIG. 3 removed.

In a sixth step, shown in FIG. 5, the silicon nitride 40 is removed by etching without removing the oxide 42.

Figure 6:
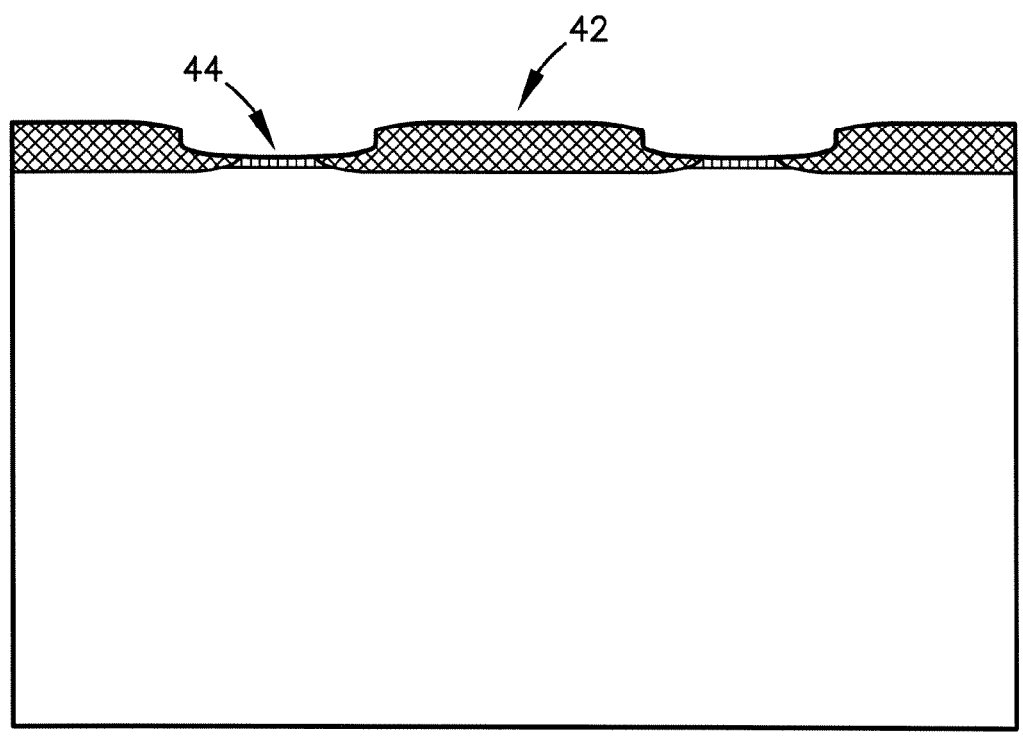
FIG. 6 is a cross-sectional elevation view following a seventh step in the method, showing an implantation of boron.

In a seventh step, shown in FIG. 6, boron 44 is implanted at a dose of approximately 3E13 and an energy of approximately 30 keV.

Figure 7:
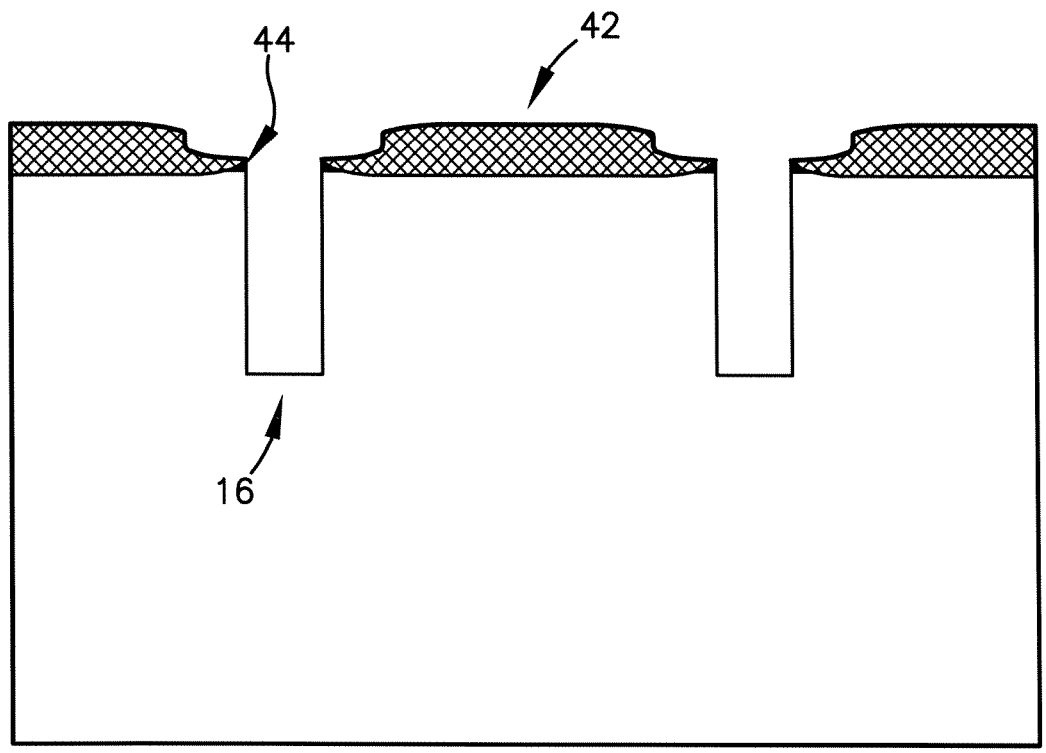
FIG. 7 is a cross-sectional elevation view following an eighth step in the method, showing an upper portion of a trench.

In an eighth step, shown in FIG. 7, the upper portion of the trench 16 is etched in the epitaxial film 12 to a depth of approximately 2.5 micrometers.

Figure 8:
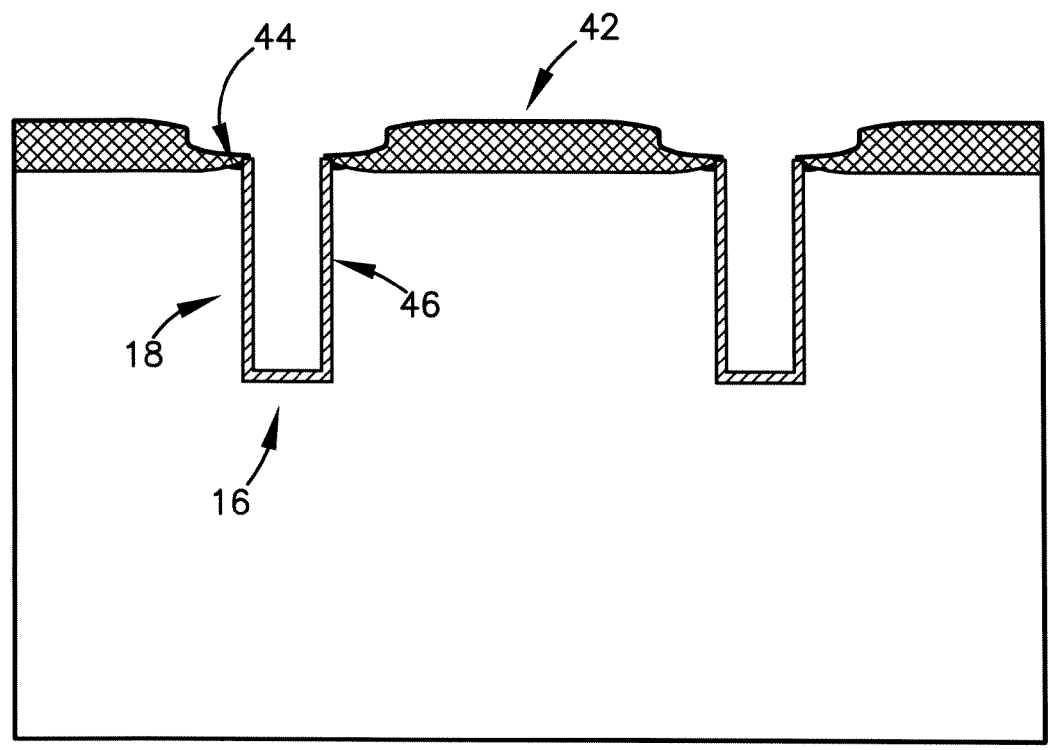
FIG. 8 is a cross-sectional elevation view following a ninth step in the method, showing a layer of oxide.

In a ninth step, shown in FIG. 8, an oxide 46 is deposited in the upper portion of the trench 16 to a thickness of approximately 0.15 micrometers, thereby creating the upper insulating region 18. In one embodiment, the oxide is CVD (chemical vapor deposition) oxide; in an alternative embodiment, the oxide is thermal oxide.

In a tenth step, the oxide 46 is etched using ion milling to approximately 0.2 micrometers.

Figure 9:
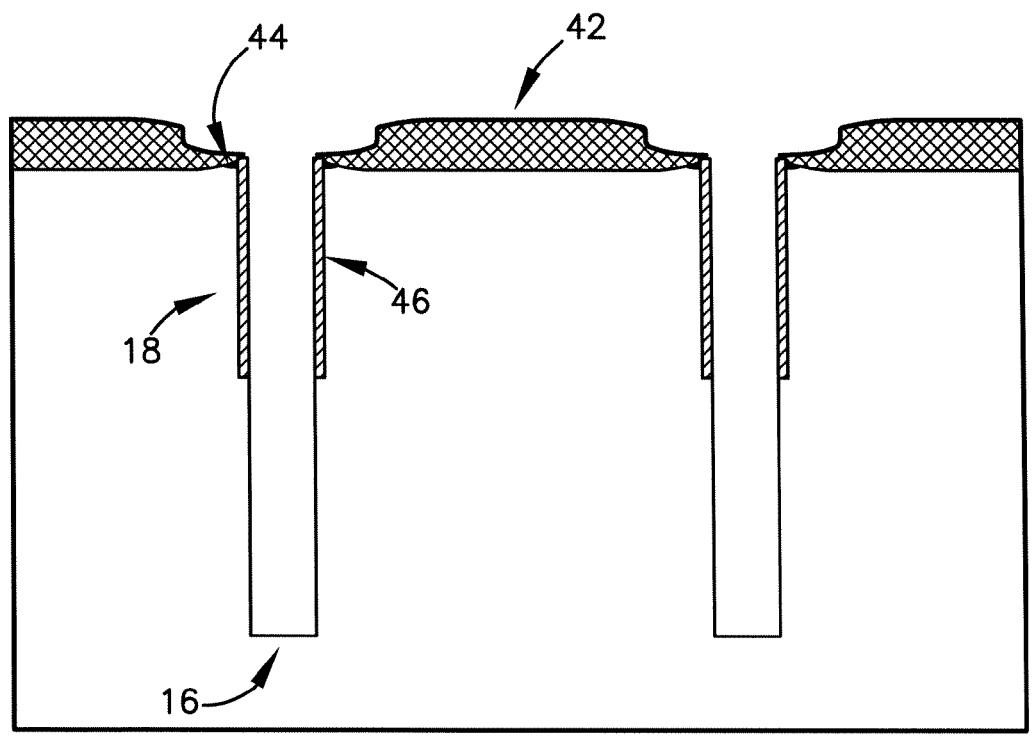
FIG. 9 is a cross-sectional elevation view following an eleventh step in the method, showing a lower portion of the trench.

In an eleventh step, shown in FIG. 9, the lower portion of the trench 16 is formed by etching to deepen the trench 16 an additional approximately 2.0 micrometers.

Figure 10:
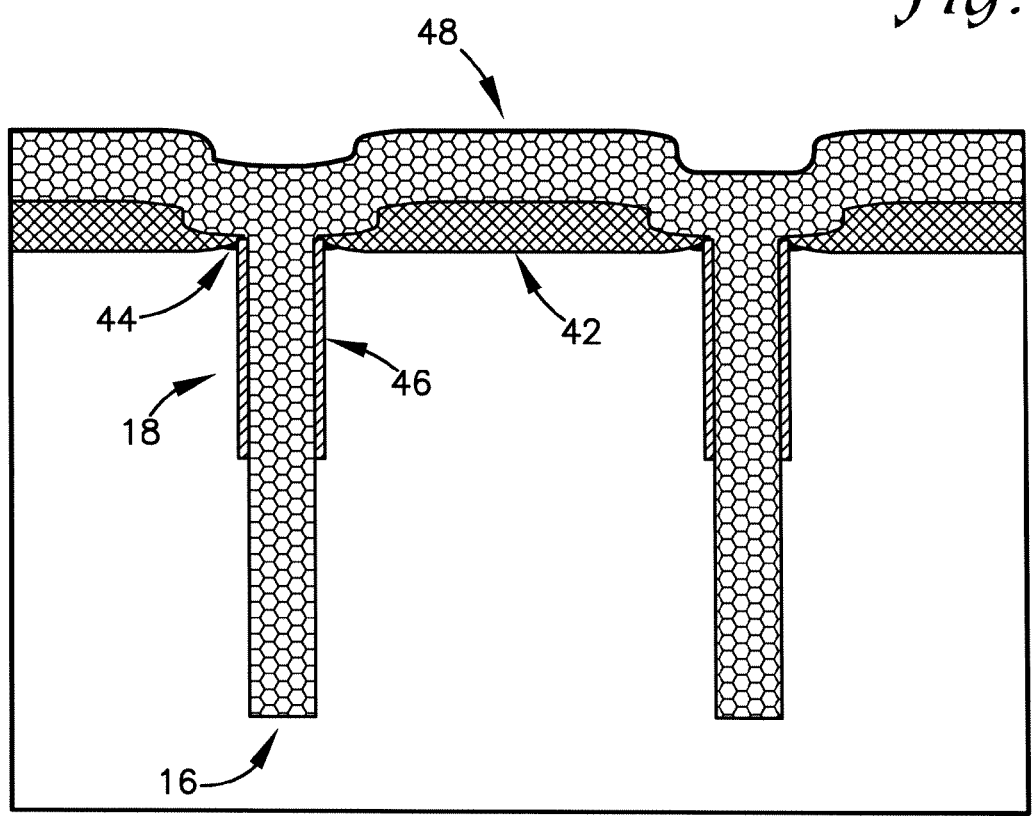
FIG. 10 is a cross-sectional elevation view following a twelfth step in the method, showing a deposit of polysilicon.

In a twelfth step, shown in FIG. 10, boron-doped polysilicon 48 is deposited to a thickness of approximately 0.3 micrometers at approximately 600 degrees Celsius.

Figure 11:
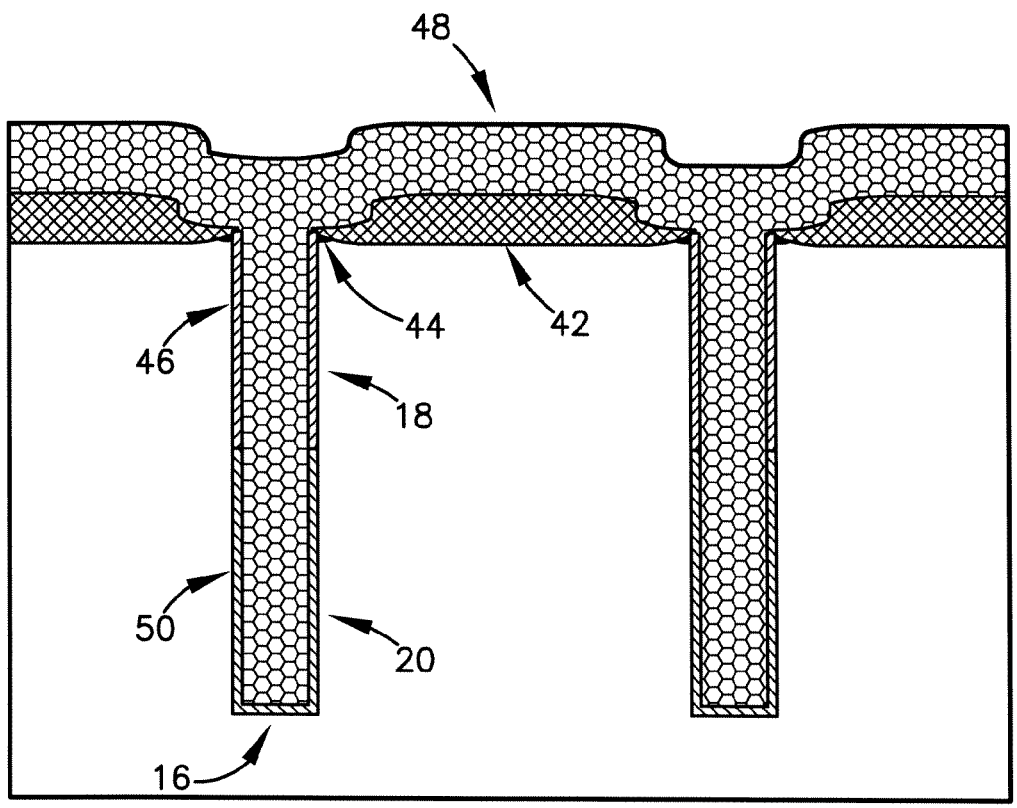
FIG. 11 is a cross-sectional elevation view following a thirteenth step in the method, showing an activation/diffusion of boron.

In a thirteenth step, shown in FIG. 11, the boron 50 within the polysilicon 48 is activated/diffused into the surface of the lower portion of the trench, 16, thereby creating the lower pn junction region 20.

Figure 12:
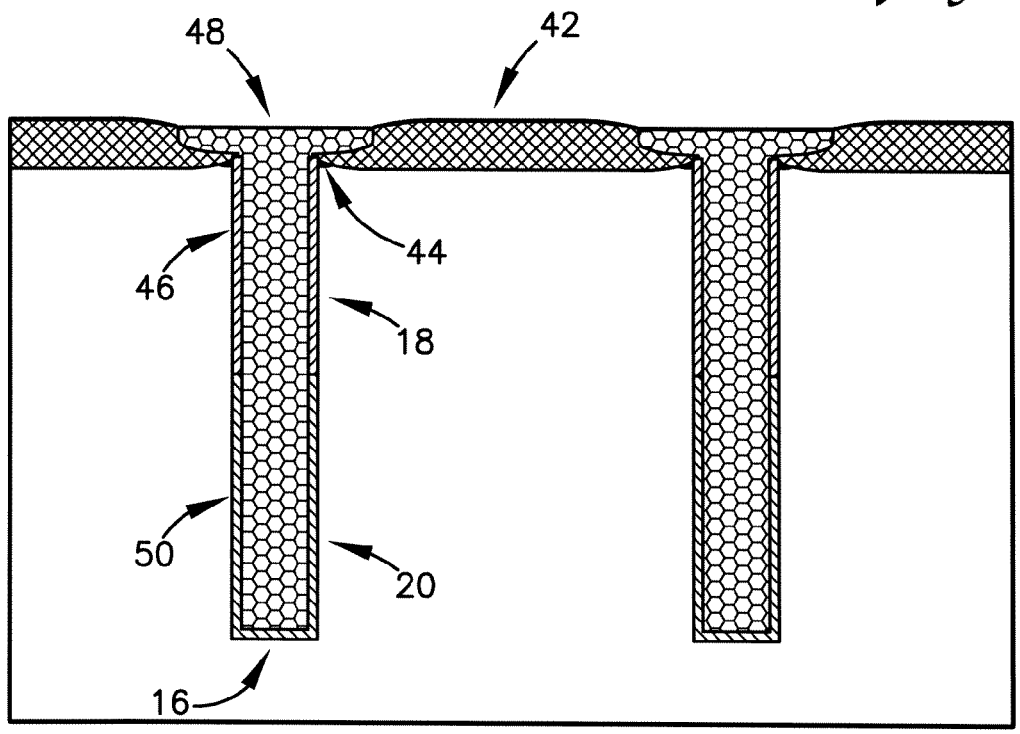
FIG. 12 is a cross-sectional elevation view following a fourteenth step in the method, showing the device having been planarized.

In a fourteenth step, shown in FIG. 12, the wafer is planarized using the initial oxide (LOCOS) as an etch stop.

In a fifteenth step, a second photolithography process is performed to define the anode contact.

Figure 13:
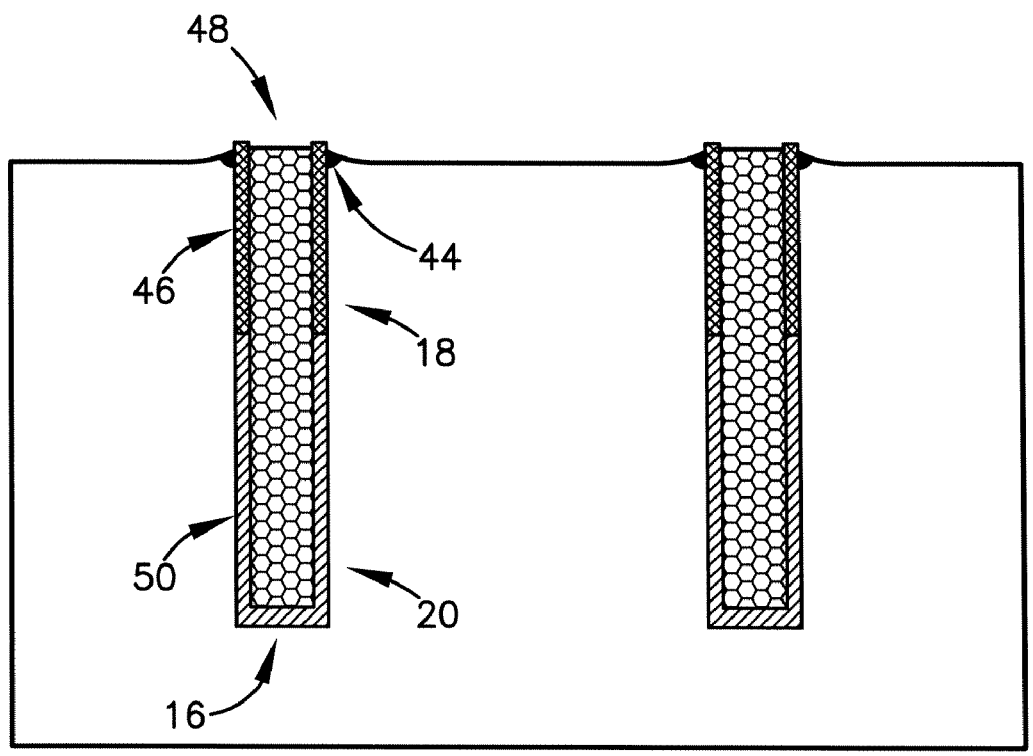
FIG. 13 is a cross-sectional elevation view following a sixteenth step in the method, showing the results of an etching process.

In a sixteenth step, shown in FIG. 13, the oxide 42 is wet etched, and the photoresist used in the previous step is removed.

In a seventeenth step, titanium is deposited for the silicide Schottky barrier 36.

Figure 14:
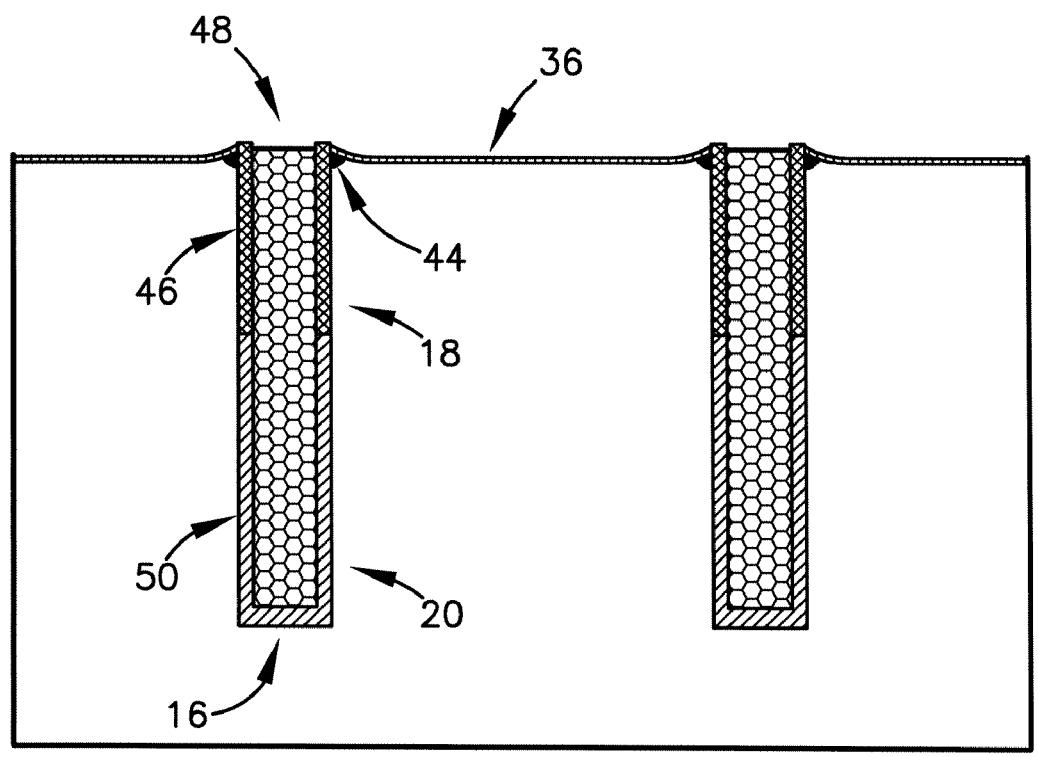
FIG. 14 is a cross-sectional elevation view following an eighteenth step in the method, showing a formation of silicide.

In an eighteenth step, shown in FIG. 14, the titanium silicide Schottky barrier 52 is formed, and the excess titanium is removed. Alternatively, other metals may be used to create the silicide Schottky barrier In a nineteenth step, shown in FIG. 15, the anode (top metal) 22 is deposited.

In a twentieth step, a third photolithography step is performed to define a metal pattern on the top (anode) side of the wafer.

In a twenty-first step, shown in FIG. 16, the metal is etched, and the photoresist used in the previous step is removed.

In a twenty-third step, the wafer is thinned.

In a twenty-fourth step, the cathode (back metal) is deposited.

From the preceding discussion, it will be understood and appreciated that the present invention provides a semiconductor rectifier device having desirable electrical characteristics, including low forward voltage drop, low reverse current leakage, and very fast switching speed matching that of Schottky rectifiers and JFETs, while remaining a majority carrier device. The device, much like a JBS rectifier, eliminates the Schottky barrier lowering which occurs in standard Schottky rectifiers, but also reverses the direction of the electric field for the portion of the drift region of the diode under current blocking bias, which reduces the reverse leakage current more effectively than the JBS rectifier. Additionally, the device better utilizes chip surface area than MBS when designed for low voltage, low VF application.

Although the invention has been described with reference to the preferred embodiment illustrated in the drawings, it is noted that equivalents may be employed and substitutions made herein without departing from the scope of the invention as recited in the claims.

The invention claimed is:

1. A semiconductor device comprising:
   a substrate;
   a multi-layer epitaxial film overlaying a top surface of the substrate,
   wherein a first layer of the multi-layer epitaxial film, includes a first dopant providing a breakdown voltage of at least approximately 30 volts, a second layer includes a second dopant providing an area of reverse-direction electric field when the device is reverse-biased, and a third layer comprises a resistivity less than resistivities of the first and second layers;
   a trench in the multi-layer epitaxial film;
   a first region associated with an upper portion of the trench; and
   a second region associated with a lower portion of the trench,
   wherein the first and second regions operate to create a zone of inverted electric field.

2. The semiconductor device as set forth in claim 1, wherein the substrate includes n-type silicon and has a wafer resistivity of approximately between 0.002 Ohm-cm and 0.005 Ohm-cm.

3. The semiconductor device as set forth in claim 1, wherein the multi-layer epitaxial film includes n-type material.

4. The semiconductor device as set forth in claim 3, wherein the multi-layer epitaxial film is doped with phosphorus.

5. The semiconductor device as set forth in claim 4, wherein the multi-layer epitaxial film includes:
   a first layer having a thickness of approximately 2 micrometers and a resistivity of approximately 0.35 Ohm-cm;
   a second layer having a thickness of approximately 3.0 micrometers and a resistivity of approximately 0.5 Ohm-cm; and
   a third layer 30 having a thickness of approximately 2.5 micrometers and a resistivity of 0.08 Ohm-cm.

6. The semiconductor device as set forth in claim 1, wherein the trench is substantially filled with polysilicon.

7. The semiconductor device as set forth in claim 6, wherein the polysilicon is doped with boron.

8. The semiconductor device as set forth in claim 7, wherein the trench is approximately between 4 micrometers and 5 micrometers deep, and approximately 1 micrometer wide.

9. The semiconductor device as set forth in claim 1, wherein the first region includes an oxide.

10. The semiconductor device as set forth in claim 1, wherein the second region includes a p+-type material.

* * * * *